United States Patent

Ishii et al.

(10) Patent No.: US 9,985,518 B2
(45) Date of Patent: May 29, 2018

(54) CIRCUIT AND MUSICAL INSTRUMENT

(71) Applicant: YAMAHA CORPORATION, Hamamatsu-shi (JP)

(72) Inventors: Jun Ishii, Hamamatsu (JP); Satsuki Kawahashi, Hamamatsu (JP); Takeshi Kono, Hamamatsu (JP); Yoshiyuki Harada, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days. days.

(21) Appl. No.: 15/409,710

(22) Filed: Jan. 19, 2017

(65) Prior Publication Data

US 2017/0207696 A1 Jul. 20, 2017

(30) Foreign Application Priority Data

Jan. 20, 2016 (JP) .................................. 2016-008374

(51) Int. Cl.
*H03F 99/00* (2009.01)
*H02J 7/34* (2006.01)
(Continued)

(52) U.S. Cl.
CPC ................ *H02M 3/04* (2013.01); *G06F 1/26* (2013.01); *G10H 1/32* (2013.01); *G10H 3/186* (2013.01); *H02J 7/0065* (2013.01); *H02M 1/32* (2013.01); *H03F 3/187* (2013.01); *H04R 3/00* (2013.01); *G06F 1/263* (2013.01); *G10H 1/46* (2013.01);
(Continued)

(58) Field of Classification Search
CPC .. H02M 3/04; H02M 1/32; H02J 7/345; H02J 1/102; H02J 2007/0067; G06F 1/263

USPC .......... 381/120; 307/43, 44, 46; 330/7, 123, 330/127, 134, 96, 156, 199
See application file for complete search history.

(56) References Cited

U.S. PATENT DOCUMENTS

2002/0018351 A1 2/2002 Vanherck
2002/0196644 A1* 12/2002 Hwang ............... H02M 1/0845
363/89

(Continued)

FOREIGN PATENT DOCUMENTS

JP 2004503199 A 1/2004

OTHER PUBLICATIONS

Extended European Search Report issued in European Appln. No. 17152083.6 dated Mar. 23, 2017.
(Continued)

*Primary Examiner* — Vivian Chin
*Assistant Examiner* — Ubachukwu Odunukwe
(74) *Attorney, Agent, or Firm* — Rossi, Kimms & McDowell LLP

(57) ABSTRACT

A circuit includes: a signal processing unit which is configured to perform signal processing; an amplifying unit which is configured to amplify a signal output from the signal processing unit; a first power supplying path which is extended from a battery to the signal processing unit; a second power supplying path which is branched from the first power supplying path, and which is extended to the amplifying unit; a power limiting unit which is provided in the second power supplying path, and which is configured to limit power flowing in the second power supplying path; and a capacitor which is connected to the second power supplying path, and which is configured to supplement power to be supplied to the amplifying unit.

6 Claims, 3 Drawing Sheets

(51) Int. Cl.
      *H02M 3/04*      (2006.01)
      *G10H 1/32*      (2006.01)
      *G10H 3/18*      (2006.01)
      *H02M 1/32*      (2007.01)
      *H04R 3/00*      (2006.01)
      *H03F 3/187*     (2006.01)
      *G06F 1/26*      (2006.01)
      *H02J 3/00*      (2006.01)
      *H03F 3/181*     (2006.01)
      *H02J 1/10*      (2006.01)
      *H02M 3/00*      (2006.01)
      *H02J 7/00*      (2006.01)
      *H02M 1/00*      (2006.01)
      *G10H 1/46*      (2006.01)

(52) U.S. Cl.
      CPC .......... *G10H 2230/035* (2013.01); *H02J 1/10* (2013.01); *H02J 1/102* (2013.01); *H02J 3/005* (2013.01); *H02J 7/34* (2013.01); *H02J 7/345* (2013.01); *H02J 2007/0067* (2013.01); *H02M 3/00* (2013.01); *H02M 2001/0048* (2013.01); *H03F 3/181* (2013.01); *H03F 2200/03* (2013.01); *H03F 2200/511* (2013.01)

(56) References Cited

U.S. PATENT DOCUMENTS

| 2003/0160513 | A1* | 8/2003 | Bramble | H02J 1/08 307/44 |
| 2004/0155634 | A1  | 8/2004 | Sasaki  | |
| 2009/0110214 | A1* | 4/2009 | Litovsky | H02J 7/0004 381/106 |

OTHER PUBLICATIONS

Office Action issued in European Appln. No. 17152083.6 dated Mar. 9, 2018.

* cited by examiner

CIRCUIT AND MUSICAL INSTRUMENT

CROSS-REFERENCE TO RELATED APPLICATION(S)

This application is based upon and claims the benefit of priority from prior Japanese patent application No. 2016-008374, filed on Jan. 20, 2016, the entire contents of which are incorporated herein by reference.

BACKGROUND

The present invention relates to a circuit and a musical instrument, equipped with an amplifying unit.

Apparatuses being equipped with a capacitor for supplementing the operating power thereof have been proposed. JP-T-2004-503199 discloses an apparatus equipped with a capacitor that is charged, for example, by the power supplied via a USB (universal serial bus) power supply line, the supply power of which is limited.

However, in the case that an apparatus is equipped with an amplifying unit, a signal processing unit for processing the signal to be input to the amplifying unit is provided together with the amplifying unit, a battery is used as the power source for supplying the power source voltage of the amplifying unit and is also used as the power source for supplying the power source voltage of the signal processing unit in some cases. In such a case, the battery supplies the voltage of the battery as the power source voltage for both the amplifying unit whose power consumption may fluctuate significantly and the signal processing unit whose power consumption fluctuates slightly. Since the power consumption of the amplifying unit fluctuates due to the amplification operation thereof, it is conceivable that the voltage of the battery may fluctuate. As a result, the fluctuations of the battery voltage directly lead to the fluctuations of the power voltage of the signal processing unit. The operation of the signal processing unit becomes unstable due to the fluctuations of the power source voltage and may cause the stop of the operation in some cases. Although JP-T-2004-503199 describes power supply to, for example, peripheral devices, but does not describe that there are differences in the power consumption fluctuations of the respective peripheral devices due to their operations, and does not describe any specific methods for distributing power between a device having large power consumption fluctuations and a device having small power consumption fluctuations.

SUMMARY

The present application has been proposed in consideration of the above-mentioned problems. The present invention relates to an apparatus equipped with an amplifying unit having large power consumption fluctuations and a signal processing unit provided to process the signal to be input to the amplifying unit and having small power consumption fluctuations. The present invention is intended to provide a circuit and a musical instrument capable of properly maintaining the power source voltages to be supplied to an amplifying unit and a signal processing unit while power is supplied to the amplifying unit and the signal processing unit from a battery commonly used for both the units.

According to an aspect of the invention, there is provided a circuit comprising: a signal processing unit which is configured to perform signal processing; an amplifying unit which is configured to amplify a signal output from the signal processing unit; a first power supplying path which is extended from a battery to the signal processing unit; a second power supplying path which is branched from the first power supplying path, and which is extended to the amplifying unit; a power limiting unit which is provided in the second power supplying path, and which is configured to limit power flowing in the second power supplying path; and a capacitor which is connected to the second power supplying path, and which is configured to supplement power to be supplied to the amplifying unit.

DETAILED DESCRIPTION OF EXEMPLARY EMBODIMENTS

Figure 1:
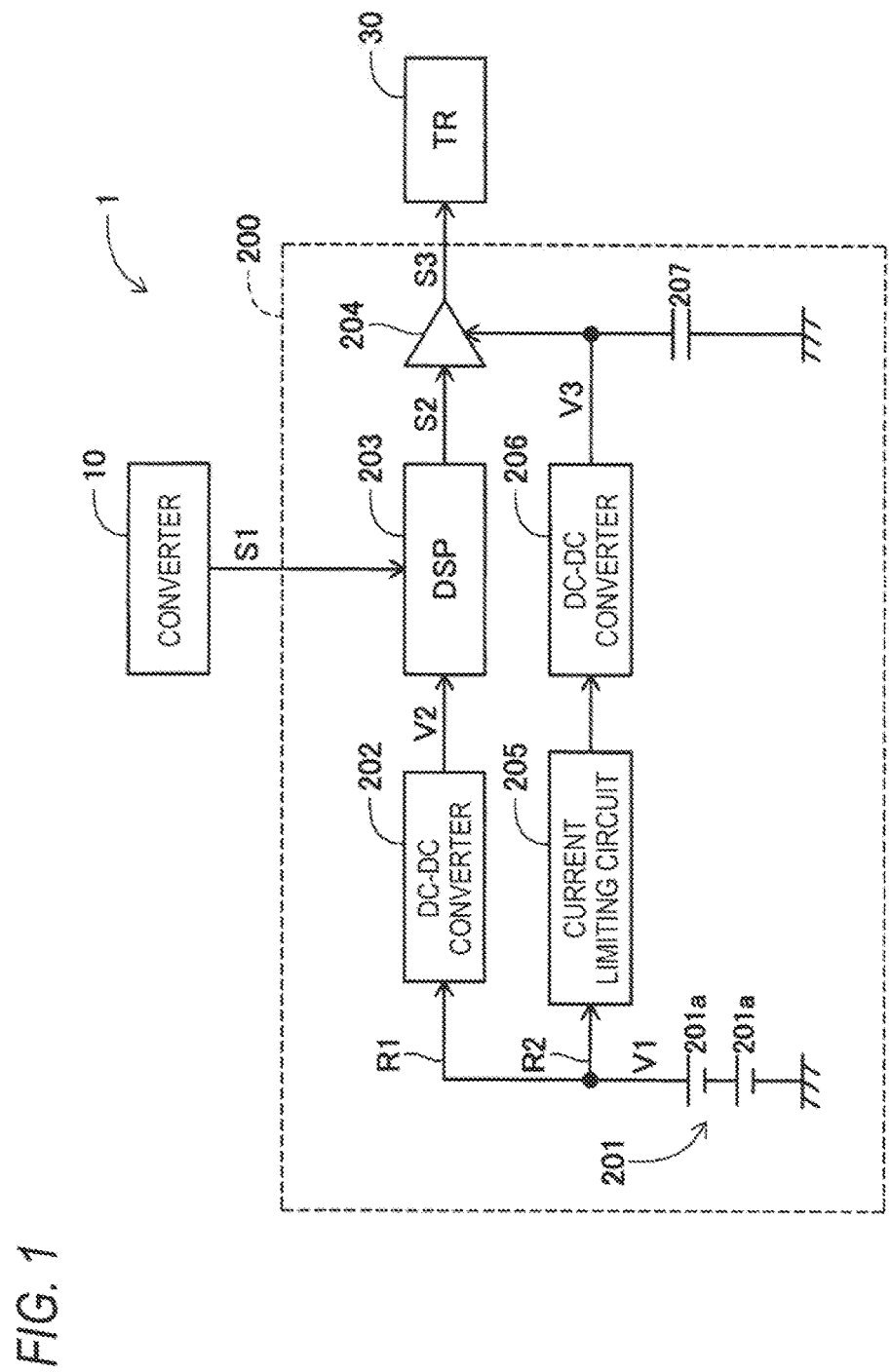
FIG. 1 is a block diagram showing an electrical configuration of a musical instrument according to a first embodiment.

A musical instrument 1 is equipped with, for example, a converter 10, a processor 200 and a transducer 30 shown in FIG. 1, in addition to the components provided for a general acoustic guitar, such as a body, a neck, a nut, a saddle, a bridge and strings, these being not shown. The body has a front board, a back board and a side board, these being not shown, assembled so as to form an inner space, and the neck is connected to the front board. The strings are stretched between the saddle disposed on the body via the bridge and the nut disposed on the neck. The converter 10 is disposed, for example, on the inner space side of the front board so as to be opposed to the bridge with the front board provided therebetween. The converter 10 has, for example, a piezo pickup and converts the vibration of the strings into a signal S1 that is an electric signal and then outputs the signal to the processor 200. The processor 200 performs predetermined signal processing for the signal S1 input thereto and outputs a signal S3 to the transducer 30. The transducer 30 is disposed, for example, on the front board and applies vibration to the front board on the basis of the signal S3. For example, when the strings are vibrated by the player, raw sound is radiated from the body resonating on the basis of the vibration of the strings, and a sound effect is radiated from the body resonating on the basis of the vibration applied by the transducer 30 to the body.

The processor 200 includes, for example, a power source 201, DC-DC converters 202 and 206, a DSP (digital signal processor) 203, an amplifier 204, a current limiting circuit 205, and a capacitor 207. The power source 201 is the power source of the processor 200 and is composed of two batteries 201a connected in series. The battery 201a is herein, for example, an AA-size alkaline dry battery. For example, in the case that an external power source, such as a DC voltage device, to be connected to a commercial power source is used as the power source of the processor 200, the power source cable to be connected to the external power source, for example, is required to be connected to the musical instrument 1. In the case that the player plays the musical instrument 1 in front of an audience, if the power source cable is connected to the musical instrument 1, the connection looks disagreeable. Furthermore, in the case of a street performance on the road, it is difficult to prepare such an external power source in some cases. In this respect, the power source 201 composed of the batteries 201a provides a good appearance and the degree of freedom in the place of performance can be enhanced.

A path R1 is a power supply path for supplying power from the power source 201 to the DSP 203 via the DC-DC converter 202. The DC-DC converter 202 boosts the voltage V1 output from the power source 201 and then outputs a voltage V2. The DSP 203 operates by using the voltage V2 as the power source voltage thereof. Furthermore, the signal S1 output from the converter 10 is input to the DSP 203. The DSP 203 converts the signal S1 being an analog signal into a digital signal, performs signal processing, such as processing for imparting reverberations and processing for adjusting volume, and then converts the generated signal into a signal S2 being an analog signal and outputs the signal S2. The power conversion efficiency of the DC-DC converter 202 is approximately 85 to 90%. Since the only one DC-DC converter, that is, the DC-DC converter 202, is provided as the DC-DC converter included in the path R1 in the series direction of the DC-DC converter 202, the power loss in the path R1 can be minimized.

A path R2 is a power supply path for supplying power from the power source 201 to the amplifier 204 via the current limiting circuit 205 and the DC-DC converter 206. The current limiting circuit 205 is connected to the output terminal of the power source 201 and makes adjustment so that the value of the current flowing in the path R2 is equal to or smaller than a preset predetermined value. The current limiting circuit 205 is implemented, for example, by a general-purpose IC. The DC-DC converter 206 is connected to the output terminal of the current limiting circuit 205, boosts the output voltage of the current limiting circuit 205, and outputs a voltage V3. The capacitor 207 is connected between the ground voltage and the output terminal of the DC-DC converter 206 and is charged by the power flowing in the path R2. Furthermore, the capacitor 207 is disposed close to the amplifier 204 and is, for example, an electrolytic capacitor of 6600 µF. In the case that the supply of power to an uncharged capacitor is started, a large current flows immediately after the start. However, since the route R2 is provided with the current limiting circuit 205, such a large current is suppressed from flowing to the capacitor 207 even in the state in which the capacitor 207 is not charged.

The amplifier 204 amplifies the power of the signal S2 that is input thereto by using the power supplied from the power source 201 through the path R2 and the power discharged from the capacitor 207 as power sources, and outputs the signal S3 to the transducer 30.

Figure 2:
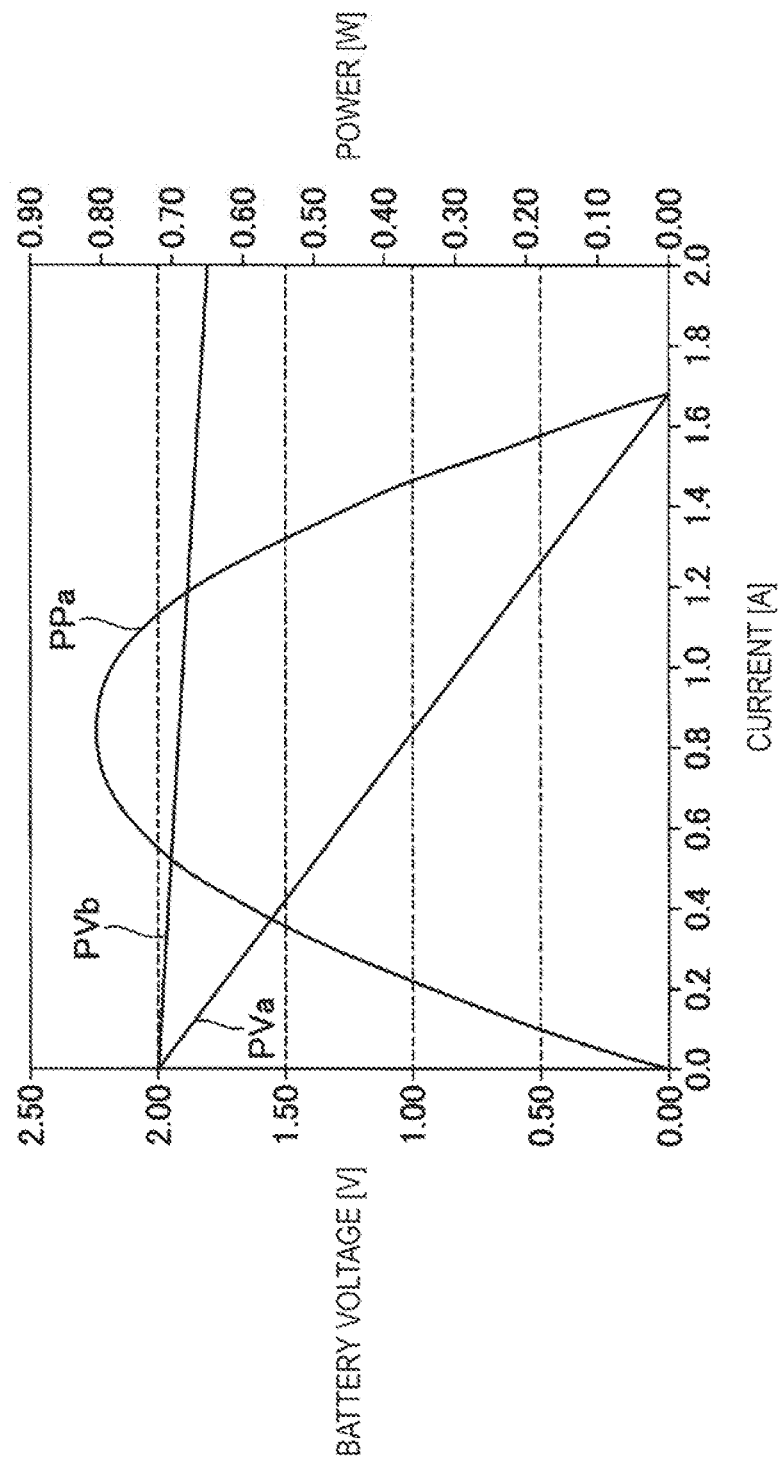
FIG. 2 is a graph showing the electrical characteristics of an alkaline dry battery and a nickel hydrogen rechargeable battery.

The electrical characteristics of batteries are herein described referring to FIG. 2. Since the internal resistance, for example, of a battery differs depending on the type of the battery, the output voltage of the battery differs depending on the type of the battery according to the value of the current drawn out from the battery. The voltage characteristic PVa and the power characteristic PPa shown in the figure are the characteristics of an alkaline dry battery immediately before the voltage of the battery reaches its termination voltage, and the voltage characteristic PVb shown in the figure is the characteristic of a nickel hydrogen rechargeable battery immediately before the voltage of the battery reaches its termination voltage. The horizontal axis of each of the voltage characteristics PVa and PVb represents the value of the current drawn out from the battery, and the vertical axis thereof (the left vertical axis in FIG. 2) represents the voltage of the battery. The horizontal axis of the power characteristic PPa represents the value of the current drawn out from the battery, and the vertical axis thereof (the right vertical axis in FIG. 2) represents the power to be output. The power characteristic PPa is based on the voltage characteristic PVa and, more specifically, indicates the value of the power obtained by multiplying the current value by the voltage value. The voltage of the battery lowers as the current to be drawn out increases, and the voltage lowering amount of the alkaline dry battery is far larger than that of the nickel hydrogen rechargeable battery in the case that the voltage characteristic PVa is compared with the voltage characteristic PVb.

In the case that the power source voltage of the amplifier 204 lowers temporarily, the power of the output signal of the amplifier 204 lowers temporarily or the output from the amplifier 204 stops temporarily. However, as the power source voltage recovers to a predetermined voltage, the output signal having a predetermined power level is output again from the amplifier 204. In other words, even in the case that the power source voltage lowers temporarily, the amplifier 204 can operate continuously. On the other hand, in the case that the power source voltage of the DSP 203 becomes lower than the predetermined value temporarily, the DSP 203 is inoperable and may shut down in some cases. When the power source voltage recovers to the predetermined voltage, the DSP 203 restarts and then resumes operation. In other words, in the case that the power source voltage lowers temporarily, the DSP 203 stops temporarily, and no signal is output from the DSP 203 in the period between the stop and the restart. In other words, in the case that the power source voltage of the amplifier 204 lowers temporarily, the operation desired for the transducer 30 is merely inactivated temporarily. However, in the case that the power source voltage of the DSP 203 lowers temporarily, the operation of the transducer 30 is not performed for a certain period. For this reason, it is important to preferentially secure the power source voltage of the DSP 203.

In addition, the power consumption of the DSP 203 for performing signal processing has small fluctuations, and the current consumption is approximately 0.1 A, for example. On the other hand, the power consumption of the amplifier 204 for performing power amplification fluctuates significantly according to the signal S3 and is larger than that of the DSP 203. If the current consumption of the amplifier 204 has already been drawn out from the batteries 201a and when the power consumption of the amplifier 204 increases temporarily, the battery voltage lowers temporarily as shown in FIG. 2. In the case that the battery voltage lowers temporarily and the power source voltage of the DSP 203 lowers in synchronization therewith, the DSP 203 shuts down as described above. In this respect, since the path R1 for supplying power to the DSP 203 is separated from the path R2 for supplying power to the amplifier 204 and the current limiting circuit 205 is provided in the path R2, the above-mentioned problem is solved. Even if the power consumption of the amplifier 204 fluctuates, since the current flowing in the path R2 is limited by the current limiting circuit 205, the current drawn out from the batteries 201a is limited, and the voltage V1 is suppressed from lowering. Since the voltage V1 is equal to or larger than the predetermined voltage, the voltage V2 is supplied stably from the DC-DC converter 202 to the DSP 203 regardless of the fluctuations in the power consumption of the amplifier 204. Hence, the shutdown of the DSP 203 due to the lowering of the power source voltage is suppressed, and the stop of the sound radiation from the transducer 30 for a certain period is suppressed.

Next, a specific configuration of the processor 200 will be described.

The power source 201 is composed of the two batteries 201a connected in series. For example, in the case that the batteries 201a are new alkaline dry batteries, the power source 201 is expected to output the voltage V1 of approximately 3 V (1.5 V×2), that is, the nominal voltage of the batteries. However, for example, when the time of use of the batteries 201a becomes long, the voltage of the batteries lowers. In order that the musical instrument 1 having the processor 200 operating stably is provided, the processor 200 is required to operate even in the case that the voltage of the batteries 201a reaches a value close to the termination voltage of 2 V (1 V×2) and that the voltage V1 is approximately 2 V. The voltage characteristic PVa and the power characteristic PPa shown in FIG. 2 indicate the characteristics of the batteries 201a having an open voltage of approximately 2 V. The maximum power is approximately 0.8 W as indicated by the power characteristic PPa. In other words, the power source 201 cannot drive a load exceeding a power level of 0.8 W. In the following descriptions, the batteries 201a having a voltage lowered close to the termination voltage are referred to as worst-case batteries 201a.

The power consumption of the amplifier 204 depends on the amplitude of the signal S2 to be input thereto. The signal S2 is based on the signal S1 output from the converter 10. The signal S1 is an audio signal based on musical performance, and the amplitude indicating the volume varies. The inventors of the present invention have found that the average amplitude of the audio signal is approximately ⅛ of the maximum amplitude and that the duration of the maximum amplitude is shorter than the duration of the average amplitude, regardless of the type of music. Furthermore, the average power consumption of the amplifier 204 is approximately 0.5 W. Hence, even if the batteries 201a are the worst-case batteries 201a during periods other than the period during which the amplifier 204 requires the instantaneous maximum power, the amplifier 204 can output the signal S3 having the desired power by virtue of the power supplied from the power source 201, and the capacitor 207 is charged. Moreover, for example, the instantaneous maximum power required in the case that the musical instrument 1 is played with a strong stroke is 2 W or more. In the case that the batteries 201a are the worst-case batteries 201a, when only the power source 201 is used, the instantaneous maximum power cannot be supplied. However, power is supplied from the capacitor 207 connected to the amplifier 204. Still further, the capacitance value of the capacitor 207 has been set so as to be able to supplement the instantaneous maximum power in the period when the amplifier 204 requires the instantaneous maximum power. Hence, in the period during which the power consumption of the amplifier 204 exceeds the average power consumption, in addition to the power supplied from the power source 201 to the amplifier 204, power is supplied from the capacitor 207, whereby the signal S3 having the desired power is output from the amplifier 204. As a result, the attack feeling of the sound effect from the transducer 30 is suppressed from being diminished. Since the processor 200 can perform the desired operation even in the case that the batteries 201a are the worst-case batteries 201a, the musical instrument 1 can function until the voltage of the batteries 201a reaches the termination voltage.

In the case of an alkaline dry battery, the voltage of the battery becomes lower as the current to be drawn out from the battery is larger. Hence, if the current to be drawn out is large, the voltage of the battery may become lower than the voltage required for driving a load in some cases. In such a case, the battery cannot drive the load although the battery is still in the state of being capable of supplying power, whereby the battery is not utilized to the fullest. However, in the processor 200, since the current flowing in the path R2 is set to a nearly constant value by the current limiting circuit 205 and the value of the current drawn out from the batteries 201a is limited, it is possible to suppress such a state in which the battery is not utilized to the fullest. Furthermore, the life of a battery generally becomes shorter as the current to be drawn out is larger. However, since the value of the current to be drawn out from the batteries 201a is limited, the life of the batteries 201a can be suppressed from becoming short. The cycle of replacing the batteries 201a can thus be elongated.

In order to drive the amplifier 204, it may be conceivable to use, for example, a method in which the number of the batteries 201a is increased so as to increase the power to be supplied from the power source 201. However, since the player plays the musical instrument 1 while supporting the instrument, the instrument is desired to be light in weight. The musical instrument 1 can be made light in weight by using the batteries 201a, two in number. Furthermore, the DC-DC converter 202 is a DC-DC converter that operates even at 1.0 V that is obtained by subtracting a margin of 1.0 V from the voltage of the worst-case batteries 201a. Hence, the DSP 203 can be driven securely until the voltage of the batteries 201a reaches the termination voltage. Although the case in which the batteries 201a are alkaline dry batteries is taken as an example in the above description, even in the case that each of the batteries 201a is a nickel hydrogen battery rechargeable battery having a nominal voltage of 1.2 V, that is, even in the case that the voltage V1 is 2.4 V, the DC-DC converter 202 can operate, whereby the processor 200 can also operate.

The DSP 203 is herein an example of a signal processing unit, and the amplifier 204 is an example of an amplifying unit. In addition, the path R1 is an example of a first power supplying path, and the path R2 is an example of a second power supplying path. The path R1 and the path R2 are, for example, electric lines. Moreover, the current limiting circuit 205 is an example of a power limiting unit.

The above-mentioned first embodiment exhibits the following advantages.

The path R2 branched from the path R1 is equipped with the current limiting circuit 205. Hence, even in the case that the power consumption of the amplifier 204 fluctuates, since the power to be supplied from the batteries 201a to the amplifier 204 is limited, the current to be drawn out from the batteries 201a is limited. Since the current drawn out from the batteries 201a is limited by the current limiting circuit 205, the voltage of the batteries 201a is suppressed from lowering. Hence, the voltage V2 serving as the power source voltage of the DSP 203 is suppressed from lowering, whereby the operation of the DSP 203 is suppressed from becoming unstable. Even in the case that the power to be supplied from the batteries 201a is limited by the current limiting circuit 205 because of the increase in the power consumption of the amplifier 204, the capacitor 207 is used to supplement the shortage of the power, whereby the signal S3 having the desired power can be obtained. The power source 201 composed of the batteries 201a, commonly used for the amplifier 204 having large power consumption fluctuations and for the DSP 203 having small power consumption fluctuations, can drive both the amplifier 204 and the DSP 203 stably.

Furthermore, even at the peak time of the voltage amplitude indicating the volume of the signal S1 serving as an audio signal, while the voltage V3 to be supplied to the DSP 203 is properly maintained by the current limiting circuit 205, the shortage of the power to be consumed by the amplifier 204 is supplemented from the capacitor 207 to the amplifier 204, whereby the power shortage of the signal S3 serving as the output signal from the amplifier 204 is suppressed. The attack feeling of the sound radiated from the transducer 30 driven by the signal S3 is suppressed from being diminished. In addition, since the current drawn out from the batteries 201a is limited by the current limiting circuit 205, the life of the batteries 201a can be suppressed from becoming short. It is thus possible to provide the musical instrument 1 having a long battery replacement cycle.

Next, a musical instrument 2 according to a second embodiment will be described. The same components as those according to the first embodiment are designated by the same reference numerals and signs, and their detailed descriptions are omitted as necessary.

Figure 3:
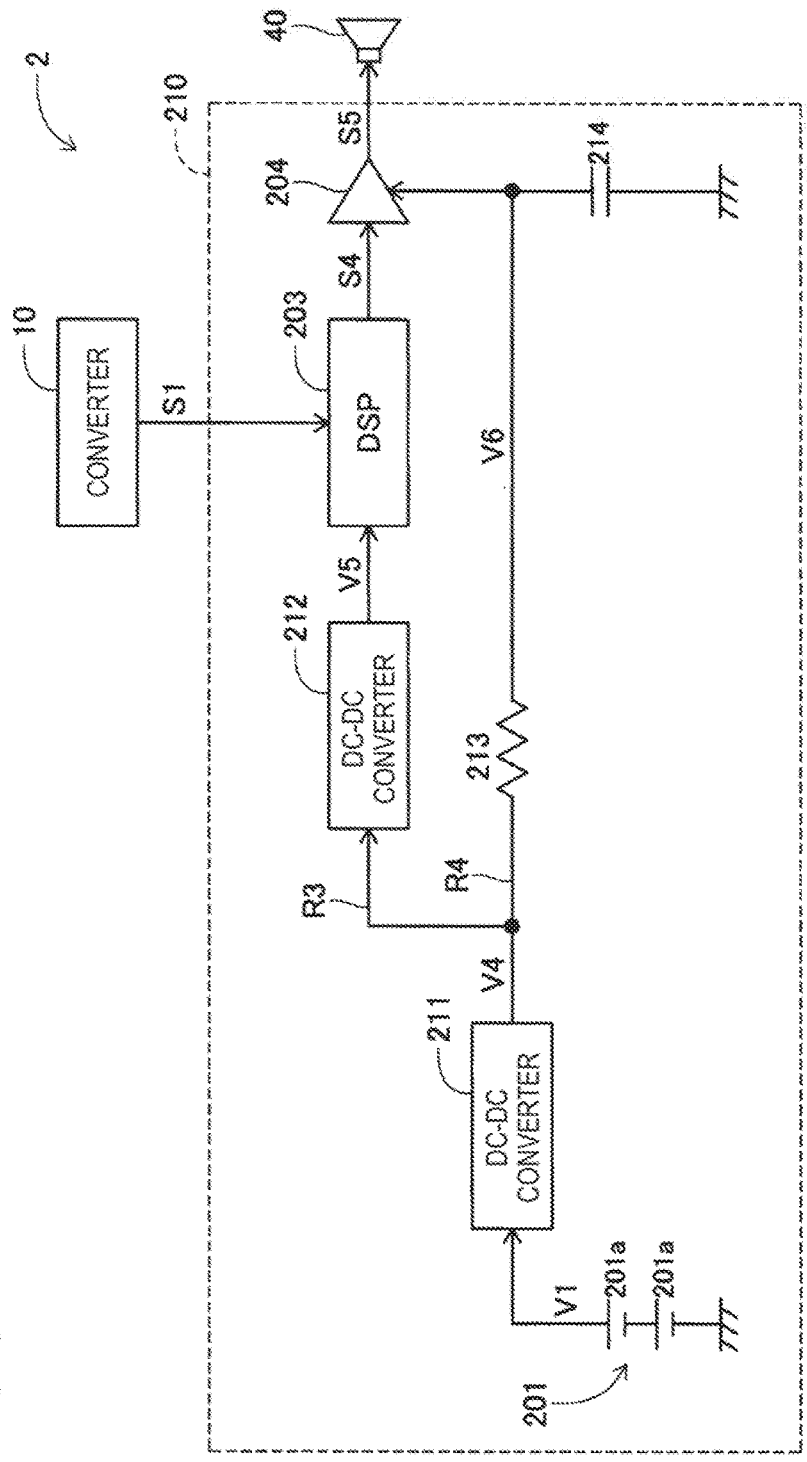
FIG. 3 is a block diagram showing an electrical configuration of a musical instrument according to a second embodiment.

The musical instrument 2 is equipped with, for example, a converter 10, a processor 210 and a speaker 40 shown in FIG. 3, in addition to components provided for a general acoustic guitar, such as a body, a neck, a nut, a saddle, a bridge and strings, these being not shown. The processor 210 includes, for example, a power source 201, DC-DC converters 211 and 212, a DSP 203, an amplifier 204, a resistor 213, and a capacitor 214. The speaker 40 is disposed, for example, in the inner space of the body. The speaker 40 is connected to the output terminal of the amplifier 204 and radiates a sound effect according to the signal S5 output from the processor 210.

A path R3 is a power supply path for supplying power from the power source 201 to the DSP 203 via the DC-DC converters 211 and 212. The DC-DC converter 211 boosts the voltage V1 output from the power source 201 and outputs a voltage V4. The DC-DC converter 212 boosts the voltage V4 and outputs a voltage V5. The DSP 203 operates by using the voltage V5 as its power source voltage and outputs a signal S4.

The path R4 is a power supply path for supplying power from the DC-DC converter 211 to the amplifier 204 via the resistor 213. One terminal of the resistor 213 is connected to the output terminal of the DC-DC converter 211 and is used to limit the power flowing in the path R4. Hence, even in a state in which the capacitor 214 is not charged, the resistor 213 can suppress a large current from flowing to the capacitor 214. The capacitor 214 is connected between the ground voltage and the other terminal of the resistor 213 and is charged by the power flowing in the path R4. The capacitor 214 is disposed close to the amplifier 204 and is, for example, an electric double-layer capacitor.

The amplifier 204 amplifies the power of the signal S4 input thereto by using the power supplied from the power source 201 through the path R4 and the power discharged from the capacitor 214 as power sources, and outputs the signal S5 to the speaker 40.

A CR low-pass filter is formed of the resistor 213 and the capacitor 214. The resistance value of the resistor 213 and the capacitance value of the capacitor 214 are herein determined so that the cutoff frequency of the CR low-pass filter formed of the resistor and the capacitor is equal to or lower than the minimum frequency contained in the signal S4. More specifically, since the amplifier 204 is generally driven in the audible frequency band, the values are set so that the cutoff frequency is equal to or lower than the audio frequency band. Hence, even if the current consumption of the amplifier 204 fluctuates according to the signal S4, the current flowing in the path R4 is limited to the DC component thereof that does not fluctuate with time, and the component of the current that fluctuates with time is replenished from the capacitor 214.

The path R3 is herein an example of a first power supplying path, and the path R4 is herein an example of a second power supplying path. The path R3 and the path R4 are, for example, electric lines. The resistor 213 is an example of a power limiting unit.

The second embodiment described above exhibits advantages similar to those of the first embodiment.

Even in the case that the power consumption of the amplifier 204 fluctuates, since the power supplied from the batteries 201a to the amplifier 204 is limited by the resistor 213, the current drawn out from the batteries 201a is limited. Hence, the voltage V1 of the batteries 201a is suppressed from lowering and fluctuating. Hence, the voltage V5 serving as the power source voltage of the DSP 203 is suppressed from lowering, whereby the operation of the DSP 203 is suppressed from becoming unstable. Even in the case that the power consumption of the amplifier 204 increases, the capacitor 214 supplements the shortage of the power, whereby the signal S5 having the desired power can be obtained. The power source 201 composed of the batteries 201a, commonly used for the amplifier 204 having large power consumption fluctuations and for the DSP 203 having small power consumption fluctuations, can drive both the amplifier 204 and the DSP 203 stably.

Furthermore, since the power is supplemented to the amplifier 204 from the capacitor 214, the shortage of the power of the signal S5 serving as the output signal of the amplifier 204 is suppressed. The attack feeling of the sound radiated from the speaker 40 driven by the signal S5 is suppressed from being diminished. It is thus possible to provide the musical instrument 2 having a long battery replacement cycle.

The present invention is not limited to the above-mentioned embodiments, but can be improved and modified variously within the scope not departing from the gist of the present invention as a matter of course.

For example, although it has been described that the musical instrument 1 is equipped with the transducer 30 and that the musical instrument 2 is equipped with the speaker 40, the musical instruments may not be limited to have these configurations; the musical instrument 1 may be configured so as to be equipped with a speaker instead of the transducer 30, and the musical instrument 2 may be configured so as to be equipped with a transducer instead of the speaker 40.

Furthermore, although it has been described that the musical instrument 1 is equipped with the current limiting circuit 205 and that the musical instrument 2 is equipped with the resistor 213, the musical instruments may not be limited to have these configurations; the musical instrument 1 may be configured so as to be equipped with a resistor instead of the current limiting circuit 205, and the musical instrument 2 may be configured so as to be equipped with a current limiting circuit instead of the resistor 213.

Moreover, in the first embodiment, although it has been described that the processor 200 includes the current limiting circuit 205 and the DC-DC converter 206, the processor 200 may be configured so as to include a DC-DC converter having a current limiting function instead of the above-mentioned configuration. Still further, although it has been described that the DC-DC converter 206 is connected to the rear stage of the current limiting circuit 205, it may be possible to have a configuration in which the current limiting circuit 205 is connected to the rear stage of the DC-DC converter 206.

Although it has been described that the power source 201 is composed of the two batteries 201a connected in series, this description does not limit the number of the batteries and does not limit the connection relation of the batteries. Furthermore, although it has been described that the battery 210a is an alkaline dry battery, the battery 201a may be another type of battery, such as a nickel hydrogen rechargeable battery or a manganese dry battery.

Moreover, in the second embodiment, although it has been described that the cutoff frequency of the CR low-pass filter formed of the resistor 213 and the capacitor 214 is equal to or lower than the minimum frequency contained in the signal S4, the second embodiment is not limited to have this configuration. Even in the case that the cutoff frequency is higher than the minimum frequency contained in the signal S4, the power supply path can be selectively used by the CR low-pass filter that is configured such that the power having a frequency equal to or lower than the cutoff frequency is supplied from the path R4 and such that the power having a frequency higher than the cutoff frequency is supplied from the capacitor 214.

In addition, in the case that priority is given to making the musical instruments 1 and 2 light in weight as described above, it is preferable that the sizes of the capacitors 214 and 207 should be reduced. In this case, since the capacitance values of the capacitors 214 and 207 become small, the maximum instantaneous power required by the amplifier 204 may not be supplied sufficiently from the capacitors 214 and 207, the power levels of the signals S3 and S4 become insufficient and the attack feelings of the sound effects radiated from the transducer 30 and the speaker 40 may be diminished. In this case, it is preferable that the signals S3 and S5 should be adjusted. More specifically, it is preferable that, for example, a limiter or a compressor should be added to the rear stage of the DSP 203 to suppress the peak values of the signals S3 and S5. Since the musical instruments 1 and 2 are each configured so as to radiate raw sound and a sound effect, even if the dynamic range of the volume of the sound effect decreases, the decrease can be compensated by the raw sound.

Furthermore, although the musical instrument 1 in which an acoustic guitar is additionally provided with the converter 10, the processor 200 and the transducer 30 and the musical instrument 2 in which an acoustic guitar is additionally provided with the converter 10, the processor 210 and the speaker 40 have been taken as examples in the above description, musical instruments additionally provided with the converter 10 and the other devices are not limited to acoustic guitars, but such devices can be added to other musical instruments. In particular, since musical instruments that are played while being supported by the players are desired so that no power cable should be extended from the instruments, the configuration of the present invention can be applied further preferably to musical instruments that are played while being supported by the players, for example, stringed instruments, such as a violin, and wind instruments, such as an oboe and a trumpet.

Moreover, although the DSP 203 has been taken as an example of a signal processing unit in the above description, the signal processing unit is not limited to the DSP 203, and the configuration of the present invention can also be applied to cases in which other digital signal processing systems, such as a CPU (central processing unit) and a PLD (programmable logic device), are used as signal processing units.

According to the invention, there is provided a circuit comprising: a signal processing unit which is configured to perform signal processing; an amplifying unit which is configured to amplify a signal output from the signal processing unit; a first power supplying path which is extended from a battery to the signal processing unit; a second power supplying path which is branched from the first power supplying path, and which is extended to the amplifying unit; a power limiting unit which is provided in the second power supplying path, and which is configured to limit power flowing in the second power supplying path; and a capacitor which is connected to the second power supplying path, and which is configured to supplement power to be supplied to the amplifying unit.

The second power supplying path branched from the first power supplying path is equipped with the power limiting unit. Hence, even in the case that the power consumption of the amplifying unit fluctuates, since the power supplied from the battery to the amplifying unit is limited, the current to be drawn out from the battery is limited. In the case that the current to be drawn out from the battery increases, the output voltage of the battery lowers, for example, due to the internal resistance of the battery. Since the current drawn out from the battery is limited by the power limiting unit, the output voltage of the battery is suppressed from lowering. Hence, the voltage to be supplied to the signal processing unit so as to be used as the power source voltage of the signal processing unit is suppressed from lowering, whereby the operation of the signal processing unit is suppressed from becoming unstable. Even in the case that the power to be supplied from the battery is limited by the power limiting unit because of the increase in the power consumption of the amplifying unit, the capacitor is used to supplement the shortage of the power, whereby a signal having the desired power can be obtained. The battery commonly used for the amplifying unit having large power consumption fluctuations and for the signal processing unit having small power consumption fluctuations can drive both the units stably.

The power limiting unit may be a current limiting circuit. The power limiting unit can be implemented by using a current limiting circuit. Even in the case that the power consumption of the amplifying unit fluctuates, since the power supplied from the battery to the amplifying unit is limited by the current limiting circuit, the output voltage of the battery is suppressed from lowering. The voltage to be supplied to the signal processing unit is suppressed from lowering, whereby the operation of the signal processing unit is suppressed from becoming unstable.

The power limiting unit may be a resistor. The power limiting unit can also be implemented by using a resistor. Even in the case that the power consumption of the amplifying unit fluctuates, the power supplied from the battery to the amplifying unit is limited by the resistor. Hence, the output voltage of the battery is suppressed from lowering. Furthermore, since a CR low-pass filter is formed of the resistor and the capacitor, the power to be drawn out from the battery can be limited to the power having frequencies equal to or lower than the cutoff frequency of the filter. Hence, the fluctuations of the power drawn out from the battery due to the fluctuations of the power consumption of the amplifying unit are suppressed. Consequently, the output voltage of the battery is suppressed from lowering and fluctuating. The voltage to be supplied to the signal processing unit is thus suppressed from lowering, whereby the operation of the signal processing unit is suppressed from becoming unstable.

A signal which is input to the signal processing unit and to which the signal processing unit is configured to perform the signal processing may be an audio signal. It is preferable that the amplifying unit should be used as a unit for amplifying the drive signal for driving a device, such as a speaker or a transducer that is driven on the basis of the output signal from the amplifying unit. In this case, the voltage amplitude indicating the volume of an audio signal varies. In the case that the signal input to the amplifying unit has peak voltage amplitude, if the power to be supplied to the amplifying unit is insufficient, the power of the output signal from the amplifying unit becomes insufficient, and the attack feeling of the sound radiated from, for example, a speaker that is driven by the output signal, may be diminished. Even at the peak time of the audio signal, while the power source voltage to be supplied to the signal processing unit is properly maintained by the power limiting unit, the shortage of the power to be consumed by the amplifying unit is supplemented by the power from the capacitor, whereby the power shortage of the output signal from the amplifying unit is suppressed. Hence, while the audio signal to be output from the signal processing unit is obtained securely, amplification can be carried out properly at the amplifying unit, whereby the attack feeling of the sound radiated from, for example, a speaker that is driven by the output signal from the amplifying unit is suppressed from being diminished.

According to the invention, there is also provided a musical instrument comprising: the circuit; the battery; and at least one of a speaker and a transducer, driven based on a signal output from the amplifying unit. Since the current drawn out from the battery is limited by the power limiting unit, the life of the battery can be suppressed from becoming short. It is thus possible to provide a musical instrument having a long battery replacement cycle.

With the circuit and the musical instrument according to the present application, the present invention can provide a circuit and a musical instrument capable of properly maintaining the power source voltages to be supplied to an amplifying unit and a signal processing unit while power is supplied to the amplifying unit and the signal processing unit from a battery that is commonly used for both the units.

What is claimed is:

1. A circuit comprising:
   a signal processing unit which is configured to perform signal processing;
   an amplifying unit which is configured to amplify a signal output from the signal processing unit;
   a first power supplying path which is extended from a battery to the signal processing unit;
   a second power supplying path which is branched from the first power supplying path, and which is extended to the amplifying unit;
   a power limiting unit which is provided in the second power supplying path, and which is configured to limit power flowing in the second power supplying path; and
   a capacitor which is connected to the second power supplying path, and which is configured to supplement power to be supplied to the amplifying unit, wherein a first terminal of the capacitor is connected to a ground terminal, and a second terminal of the capacitor is connected to the amplifying unit and the second power supplying path.

2. The circuit according to claim 1, wherein the power limiting unit is a current limiting circuit.

3. The circuit according to claim 2, wherein the current limiting circuit is configured to make adjustment so that a value of current flowing in the second power supplying path is equal to or smaller than a preset predetermined value.

4. The circuit according to claim 1, wherein the power limiting unit is a resistor.

5. The circuit according to claim 1, wherein a signal which is input to the signal processing unit and to which the signal processing unit is configured to perform the signal processing is an audio signal.

6. A musical instrument comprising:
   a circuit comprising:
   a signal processing unit which is configured to perform signal processing;
   an amplifying unit which is configured to amplify a signal output from the signal processing unit;
   a first power supplying path which is extended from a battery to the signal processing unit;
   a second power supplying path which is branched from the first power supplying path, and which is extended to the amplifying unit;
   a power limiting unit which is provided in the second power supplying path, and which is configured to limit power flowing in the second power supplying path; and
   a capacitor which is connected to the second power supplying path, and which is configured to supplement power to be supplied to the amplifying unit, wherein a first terminal of the capacitor is connected to a ground terminal, and a second terminal of the capacitor is connected to the amplifying unit and the second power supplying path;
   a battery; and
   at least one of a speaker and a transducer, driven based on a signal output from the amplifying unit.

* * * * *